United States Patent [19]
Ito et al.

[11] Patent Number: 5,700,605
[45] Date of Patent: Dec. 23, 1997

[54] MASK FOR LIGHT EXPOSURE AND PROCESS FOR PRODUCTION OF THE SAME

[75] Inventors: Shin-ichi Ito, Yokohama; Takayuki Iwamatsu, Abiko, both of Japan

[73] Assignee: Kabushiki Kaisha Toshiba, Kawasaki, Japan

[21] Appl. No.: 616,306

[22] Filed: Mar. 15, 1996

[30] Foreign Application Priority Data

Mar. 15, 1995 [JP] Japan .................................. 7-056089
Mar. 21, 1996 [JP] Japan .................................. 8-055141

[51] Int. Cl.6 .................................................. G03F 9/00
[52] U.S. Cl. ...................... 430/5; 430/322; 430/323; 430/324
[58] Field of Search ........................ 430/5, 322, 323, 430/324

[56] References Cited

U.S. PATENT DOCUMENTS 5,276,551  1/1994  Nakagawa ........................ 430/5
5,409,789  4/1995  Ito ..................................... 430/5
5,480,747  1/1996  Vasudev ............................ 430/5

FOREIGN PATENT DOCUMENTS 6-123961  5/1994  Japan .

Primary Examiner—S. Rosasco
Attorney, Agent, or Firm—Oblon, Spivak, McClelland, Maier & Neustadt, P.C.

[57] ABSTRACT

There is disclosed a mask for light exposure which comprises being provided with a light transparent substrate and a mask pattern formed on the light transparent substrate, the mask pattern comprising a light screening pattern composed of a material which screens the exposure light and transmits the light having the longer wavelength than that of the exposure light and a phase shift pattern formed by engraving a part of the light transparent substrate.

25 Claims, 9 Drawing Sheets

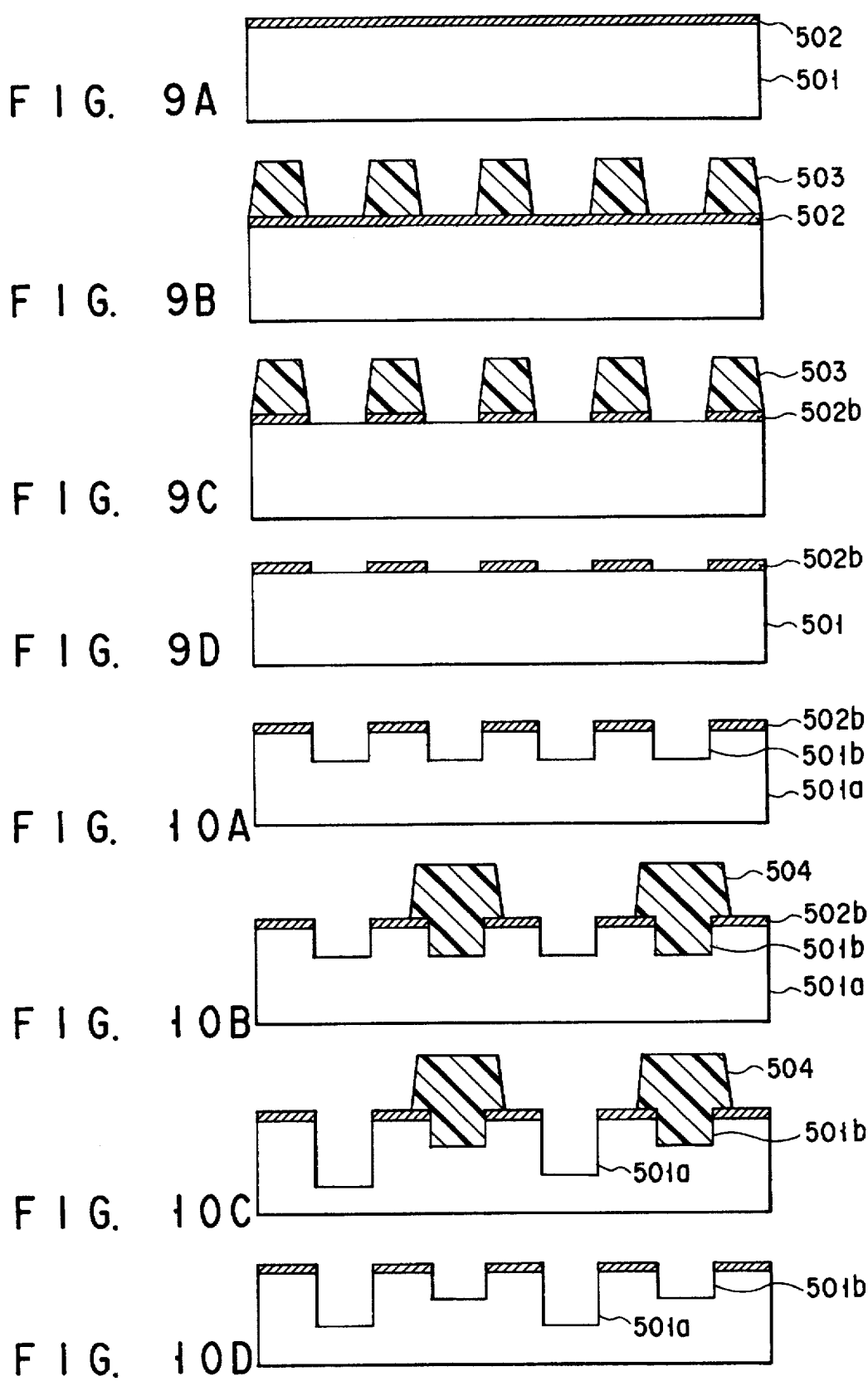

MASK FOR LIGHT EXPOSURE AND PROCESS FOR PRODUCTION OF THE SAME

BACKGROUND OF THE INVENTION

1. Field of the Invention

The present invention relates to a mask for light exposure used for the lithography step in an apparatus for manufacturing a semiconductor. More particularly, the present invention relates to a mask for light exposure obtained by engraving a light transparent substrate to form a phase shift pattern.

2. Description of the Related Art

Along with advances in semiconductor techniques there is a requirement for increased speed and increased integration density. With the progress thereof, the necessity of miniaturization of a pattern grows increasingly higher and there is an increased demand for miniaturization and high integration in the pattern size.

In order to satisfy this demand, the short wavelength light such as far ultraviolet light has been used for the light source for light exposure. On the other hand, miniaturization without change of the light source for light exposure has been recently tried. One example thereof is a phase shift method. This method aims at improving the pattern accuracy by partially providing a phase inverted layer on a light transparent part so as to eliminate the adverse effects derived from the light diffraction raised between adjacent patterns.

Among the phase shift method, especially, there is Levenson type phase shift method which can improve the resolving power. In this method, phase shifters are arranged alternately relative to light transparent parts, in a mask provided with light screening patterns. The phase of the light which has passed through this phase shifter is reverted by 180° relative to the light which has passed a part arranged with no phase shifter. Like this, the resolving power is improved by reverting the phase of the light of an adjacent transparent part to produce negative light interference between mutual patterns.

This Levenson type phase shift mask can be manufactured by engraving a substrate as described in JP-A 62-189468. However, such the mask has the problem that the difference in luminous intensity occurs between a phase shift part where a substrate is engraved and a non-phase shift part where a substrate is not engraved, even if the size of an opening is the same. This problem attributes to the size of an opening optically narrowed by interference of an edge part of patterns parallel to the optical axis in the phase shift part. In order to solve this problem, Japanese Patent Application No. 6-43618 describes a method for attaining uniform luminous intensity by engraving both openings so as to occur interference of an edge of patterns at both openings.

Cross-sectional structure of a mask for light exposure manufactured by engraving adjacent both openings described in Japanese Patent Application No. 6-43618 is shown in FIG. 2A. In the FIG., 101 represents a light transparent substrate. As a light screening pattern 102a, a chromium compound has been mainly used. The composition of this chromium compound has been adjusted so as to manifest light screening properties not only at light exposure wavelength but also at any wavelength of visible and shorter wavelength areas. An engraved amount in both openings 103 and 104 is adjusted so that the lights passing through the adjacent openings 103 and 104 have the opposite phase. The difference in an engraved amount in openings 103 and 104 is so designed as to approximately equal ½ of light exposure wavelength λ in optical path difference terms (thickness of a phase sifter). In addition, an engraved amount in a shallowly engraved part (bias amount) is adjusted so that it approximately equals the difference between respective engraved amounts in openings 103 and 104.

However, this kind of mask for light exposure has the following problems. That is, for testing this mask for light exposure by optical procedures, the relative phase difference (thickness of a phase shifter: difference between the depth of opening 103 and that of opening 104) can be examined, but the bias amount (depth of opening 103 or 104) can not be examined. In addition, since the bias amount can not be examined, it is difficult to accurately control the bias amount upon manufacture of the mask for light exposure.

As described above, in the mask manufactured by engraving both adjacent openings, although the difference between engraved amounts in adjacent openings can be measured, each engraved amount can not be measured. Further, it is difficult to manufacture a mask for light exposure by accurately controlling the bias amount.

SUMMARY OF THE INVENTION

The first object of the present invention is to provide a mask for light exposure which can measure not only the difference between engraved amounts in adjacent openings but also each engraved amount.

The second object of the present invention is to provide a process for production of such the mask for light exposure.

These object as well as other objects and advantages of the present invention will become apparent to those skilled in the art from the following description with reference to the accompanying drawings.

The first object of the present invention is accomplished by the following mask. That is, the present invention provides a mask for light exposure which comprises being provided with a light transparent substrate and a mask pattern formed on the light transparent substrate, the mask pattern comprising a light screening pattern composed of a material which screens the exposure light and transmits the light having the longer wavelength than that of the exposure light, and a phase shift pattern formed by engraving a part of the light transparent substrate.

The second object of the present invention is accomplished by the following process for production of a mask for light exposure. That is, the present invention provides a process for production of a mask for light exposure provided with a light transparent substrate and a mask pattern formed on the light transparent substrate, the mask pattern comprising a light screening pattern composed of a material which screens the exposure light and transmits the light having the longer wavelength than that of the exposure light, and a phase shift pattern formed by engraving a part of the light transparent substrate, the process comprising:

calculating an etched depth of the light transparent substrate by determining the difference of an optical image and phase between the light passing through the light screening pattern and the light passing through an opening of the light screening pattern using the light having the longer wavelength than that of the exposure light.

The second object of the present invention is also accomplished by the following process for production of a mask for light exposure. That is, the present invention provides a process for production of a mask for light exposure provided with a light transparent substrate and a mask pattern formed on the light transparent substrate, the mask pattern comprising a light screening pattern and a phase shift pattern formed by engraving a part of the light transparent substrate, the process comprising the following steps:

a step of forming the light screening pattern composed of a material which screens the exposure light and transmits the light having the longer wavelength than that of the exposure light, on the light transparent substrate;

a step of etching the substrate using the light screening pattern and a resist as a mask while selectively masking an opening of the light screening pattern with the resist and determining the phase difference between the light passing through the light screening pattern and the light passing through the opening of the light screening pattern using the light having the longer wavelength than that of the exposure light, then stopping etching at a time when the desired phase difference is obtained; and a step of removing the resist.

The second object of the present invention is also accomplished by the following process for a mask for light exposure. That is, the present invention provides a process for production of a mask for light exposure provided with a light transparent substrate and a mask pattern formed on the light transparent substrate, the mask pattern comprising a light screening pattern and a phase shift pattern formed by engraving a part of the light transparent substrate, the process comprising the following steps:

a step of forming the light screening pattern composed of a material which screens the exposure light and transmits the light having the longer wavelength than that of the exposure light, on the light transparent substrate;

a step of etching the substrate using the light screening pattern and a resist as a mask while selectively masking an opening of the light screening pattern with the resist and determining the phase difference between the light passing through the light screening pattern and the light passing through the opening of the light screening pattern using the light having the wavelength range which the light screening material transmits, then stopping etching at a time when the desired phase difference is obtained;

a step of, after removal of the resist, etching the substrate using the light screening pattern as a mask while determining the phase difference between the light passing through the light screening pattern and the light passing through the opening of the light screening pattern using the light having the longer wavelength than that of the exposure light, then stopping etching at a time when the desired phase difference is obtained.

BRIEF DESCRIPTION OF THE DRAWINGS

FIGS. 9A to 9D are views illustrating the first half steps for manufacturing the fifth embodiment of the present mask for light exposure;

FIGS. 10A to 10D are views illustrating the second half steps for manufacturing the fifth embodiment of the present mask for light exposure;

DETAILED DESCRIPTION OF THE PREFERRED EMBODIMENTS

Figure 1:
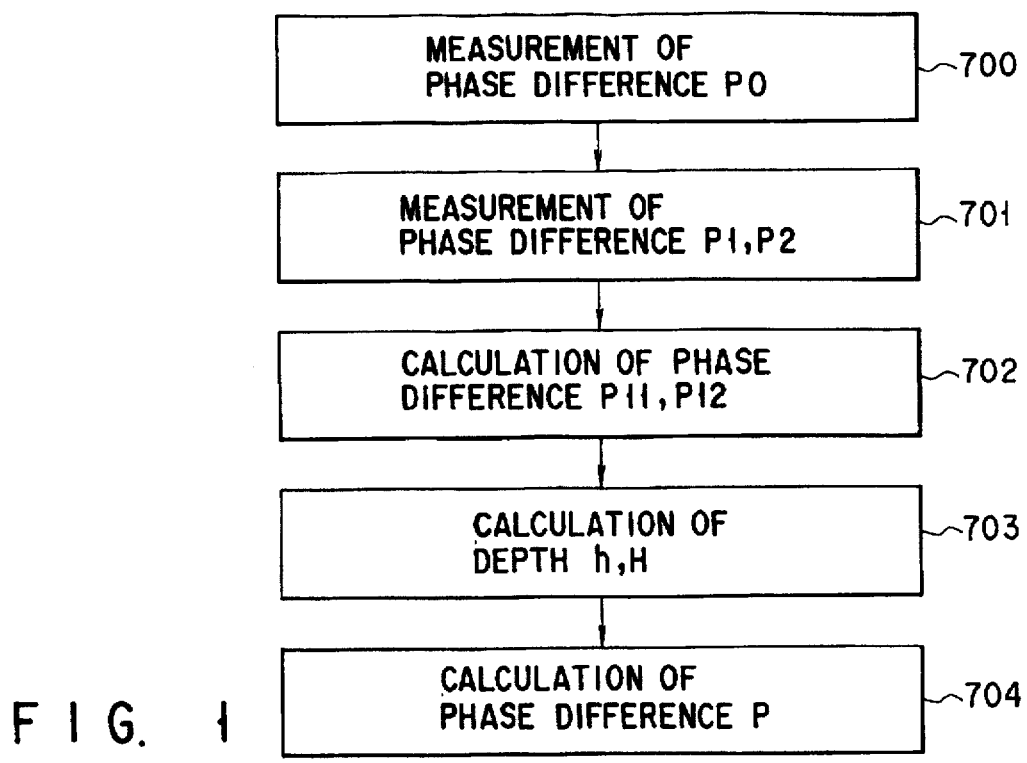
FIG. 1 is a flow sheet illustrating the procedures calculating the bias amount h and the phase difference P at the light exposure wavelength in the present invention.

The principle in the present invention is explained prior to the description of the best mode. That is, the present invention is characterized in that, in a mask for light exposure provided with a light transparent substrate and a mask pattern formed on the light transparent substrate, said mask pattern comprising a light screening pattern and a phase shift pattern formed by engraving a part of the substrate, the light screening pattern is composed of a material having such the properties that screens the exposure light and transmits the light having the longer wavelength than that of the exposure light.

The substrate is characterized in that it is engraved at two kinds of depth, and the difference between respective engraved amounts approximately equals an engraved amount of the shallowly engraved part. Further, the substrate is characterized in that it has the phase difference of approximate 180 degree relative to the exposure light due to the difference between respective engraved amounts.

Alternatively, the substrate is characterized in that it is engraved at one or more kinds of depths and the light passing through at least the above engraved part has the phase difference of approximate 180 degree relative to the light passing through an non-processed area of the light transparent substrate.

The longer wavelength area has desirably such the wavelength that the transmittance of a film having the light screening properties at light exposure wavelength is not less than 4%. In addition, the transmittance of the film having the light screening properties is desirably not greater than about 0.1% at the light exposure wavelength.

The pattern having the light screening properties at the light exposure wavelength is desirably composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof. In this case, the pattern may be formed by a mono-layer film of the materials, or plurality of multilayer films having compositions each indicate difference characters.

The present invention is characterized in that, in a process for production of the above mask for light exposure, that is, a mask for light exposure provided with at least a light transparent substrate and a master pattern, formed on the light transparent substrate, comprising a light screening pattern and a phase shift pattern formed by engraving a part of the substrate, said light screening pattern being composed of a material having such the properties that screens the exposure light and transmits the light having the longer wavelength than that of the exposure light, an etched depth of the light transparent substrate is calculated by determining the phase difference (optical path difference) between the light passing through the light screening pattern and the light passing through an opening of the light screening pattern using the light having the longer wavelength than that of the exposure light.

In a preferable aspect, the present invention provides a process for production of a mask for light exposure provided a light transparent substrate and a mask pattern, formed on the light transparent substrate, comprising a light screening pattern and a phase shift pattern formed by engraving a part of the substrate, said process comprising a step of forming the light screening pattern composed of a material having such the properties that screens the exposure light and transmits the light having the longer wavelength than that of the exposure light, on said light transparent substrate, a step of etching the substrate using the light screening pattern and a resist as a mask while selectively masking an opening of the light screening pattern with the resist and determining the phase difference (optical path difference) between the light passing through the light screening pattern and the light passing through the opening of the light screening pattern using the light having the longer wavelength than that of the exposure light, then stopping etching at a time when the desired phase difference is obtained, and a step of removing the resist.

In a preferable aspect, the present invention also provides a process for production of a mask for light exposure provided with a light transparent substrate and a mask pattern, formed on the light transparent substrate, comprising a light screening pattern and a phase shift pattern formed by engraving a part of the substrate, said process comprising a step of forming the light screening pattern composed of a material having such the properties that screens the exposure light and transmits the light having the longer wavelength than that of the exposure light, on said light transparent substrate, a step of etching the substrate using the light screening pattern and a resist as a mask while selectively masking an opening of the light screening pattern with the resist and determining the phase difference (optical path difference) between the light passing through the light screening pattern and the light passing through the opening of the light screening pattern using the light having the longer wavelength than that of the exposure light, then stopping etching at a time when the desired phase difference is obtained, and a step of, after removal of the resist, etching the substrate using the light screening pattern as a mask while determining the phase difference (optical path difference) between the light passing through the light screening pattern and the light passing through the opening of the light screening pattern using the light having the longer wavelength than that of the exposure light, then stopping etching at a time when the desired phase difference is obtained.

Determination of the phase difference is characterized in that the phase difference is calculated from the measured value of optical path difference between the light passing through the light screening pattern and the light passing through the opening of the light screening pattern, or from a changed amount of focus position of the light passing through the opening of the light screening pattern in an optical image at virtual non-transferred substrate plane.

The step of determining the phase difference (optical path difference) is desirably carried out on the individual patterns having different engraved amount from that of the light screening pattern and an area of the light transparent substrate to be not grayed using the light having the longer wavelength than that of the exposure light. In this step, an engraved amount of the individual patterns or the phase difference is obtained from the difference between respective optical paths and the wavelength used for measuring the optical path, refractive index of the light transparent substrate at the wavelength for measuring the optical path, the light exposure wavelength, and refractive index of the light transparent substrate at the light exposure wavelength.

The substrate is characterized in that it is engraved at two kinds of the depths, and the difference between respective engraved amounts approximately equals the shallower engraved amount. Further, the substrate is characterized in that it has the phase difference of approximate 180 degree relative to the exposure light due to the difference between respective engraved amounts.

Alternatively, the substrate is characterized in that it is engraved at one or more kinds of depths, the light passing through at least a part of the engraved part has the phase difference of approximate 180 degree relative to the light passing through a non-processed area of the light transparent substrate.

The longer wavelength area has desirably such the wavelength that the transmittance of a film having the light screening properties at the light exposure wavelength is not less than 4%. In addition, the transmittance of the film having the light screening properties is desirably not greater than about 0.1% at the light exposure wavelength.

The pattern having the light screening properties at the light exposure wavelength is desirably composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof.

The following effects are attained according to the above-described invention. That is, in a mask where the lights passing through adjacent openings have opposite phase so as to produce negative interference to separate the patterns, the transmittance of the light screening part at the light exposure wavelength is required to be as near zero as possible. When silicon oxide nitride ($SiN_xO_y$) is used for the light screening material and a ratio of silicon, the film transmittance at the light exposure wavelength can be lowered to about 0.1% and the transmittance of not less than 30% can be obtained at the wavelength longer than 365 nm by adjusting a ratio of silicon, nitrogen and oxygen.

Figure 2A:
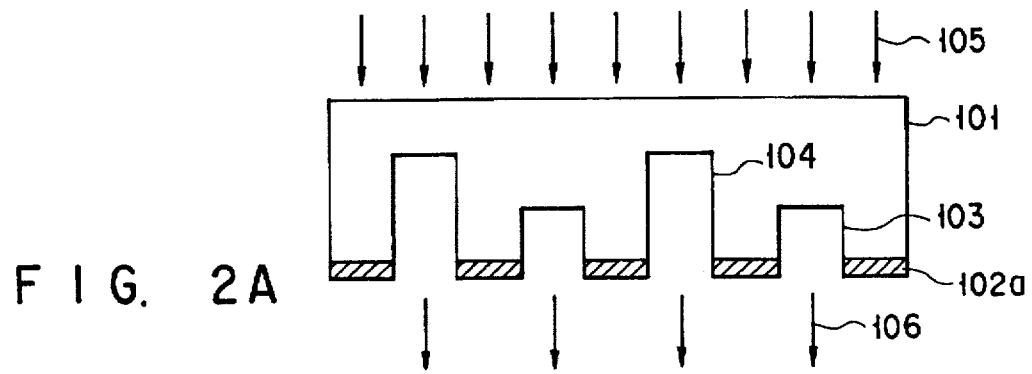
FIG. 2A is a view showing the cross-sectional structure of the present mask for light exposure.

A light screening film having complex index of refraction of 2.07−0.642i at ArF (wavelength 193 nm) was made of $SiN_xO_y$. The light screening properties of the transmittance of about 0.1% (complex index of refraction =2.07−0.642i) at ArF can be conferred on this material by adjusting the thickness to 160 nm. The cross-sectional structure of this mask for light exposure is shown in FIG. 2A and it has fundamentally the same structure as that of prior one. In the FIG., 101 is a light transparent substrate, 102a is a light screening pattern made of silicon oxide nitride, 103 is a shallowly engraved part, and 104 is a deeply engraved part. The light screening pattern 102a is made of a different material form that of prior art but can screens the exposure light of ArF light.

Figure 2B:
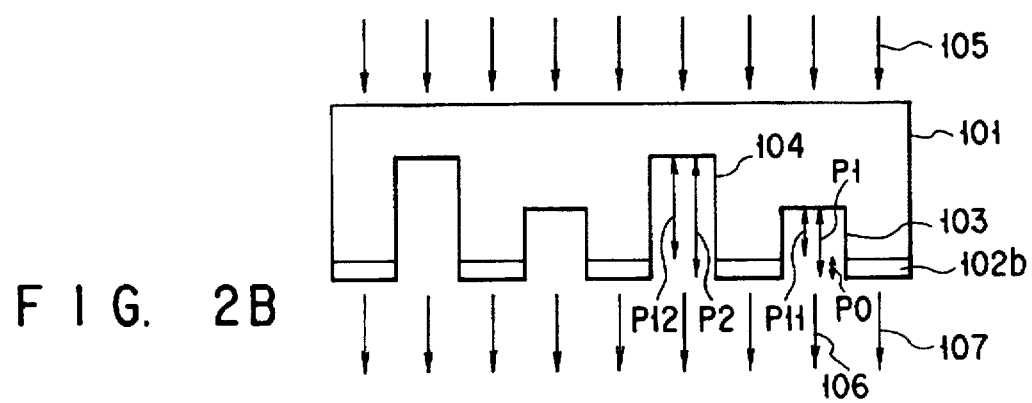
FIG. 2B is a view showing translucent situations at the light exposure wavelength and the phase test wavelength.

The present invention is different from the prior art in that a film constituting a light screening pattern 102b has, in a longer wavelength area than the exposure light, the transmittance of about 39% (complex index of refraction= 2.17–0.157i) at I ray (wavelength 365 nm) and the transmittance of about 92% at He—Ne laser (wavelength 633 nm) area, as shown in FIG. 2B. The thickness of a phase shifter and the bias amount can be obtained by determining the optical path difference between a pattern composed of SiN$_x$O$_y$ film and a phase shift pattern formed by engraving the substrate at a wavelength area where the transmittance of SiO$_x$N$_y$ film becomes higher.

The procedures thereof are explained refereeing to FIGS. 1 and 2B. P0 is taken as the phase difference between the light screening film 102b and the substrate 101 at the test wavelength (700). Similarly, P1 and P2 are taken as the phase difference between the shallowly engraved part 103 and the light screening film 102b and the phase difference between the deeply graved part 104 and the light screening film 102, respectively (701). From these, the phase differences between the substrate surface and the engraved parts of the substrate are obtained, respectively, as follow follows (702):

The shallowly engraved part: P11=P1−P0

The deeply engraved part: P12=P2−P0

Assumed that the refractive index of the light transparent substrate at the test wavelength λ1 is N1 and the refractive index of the light transparent substrate at light exposure wavelength λ2 is N2, respective depths are obtained, respectively, from P11 and P12 as well as N1 and N2 as follows (703):

The depth of the shallowly engraved part h=P11×λ1/{2π(N1−1)}

The depth of the deeply engraved part H=P12×λ1/{2π(N1−1)}.

From these, the bias amount h (depth of the shallowly engraved part) can be easily obtained (704). In addition, the phase difference P at the light exposure wavelength can be obtained as follows (704):

$$P = 2\pi (H-h) \times (N2-1)/\lambda 2$$

The resultant P is a value calculated in disregard of multi-interference. However, in the case of a light transparent substrate having the multi-layer structure, it is desirable that P is obtained taking multi-interference into consideration based on the optical theory described in Tsurukawa, Oyokogaku II, p. 119, published by Baifukan and the like.

Alternatively, the phase difference P can also be obtained by directly measuring the phase difference between the shallowly engraved part and the deeply engraved part at the light exposure wavelength.

The best mode of the present invention is explained in detail with reference to the accompanying drawings.

EXAMPLE 1

FIGS. 3A to 3D and FIGS. 4A to 4D are cross-sectional views showing the steps for manufacturing the first embodiment of the present mask for light exposure. This embodiment relates to a Levenson type phase shift mask for ArF light exposure. The mask is so manufactured as to engrave openings alternately at different degree.

Figure 3A:
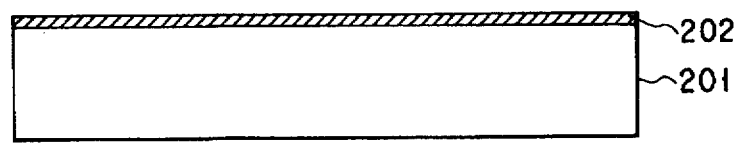
FIGS. 3A to 3D are views illustrating the first half steps for manufacturing the first embodiment of the present mask for light exposure.

Firstly, a SiN$_x$O$_y$ light screening film 202 having complex index of refraction of 2.07–0.642i and having the thickness of 160 nm was formed on a light transparent substrate 201. At this point, the luminous intensity transmittance of a part where SiN$_x$O$_y$ film was formed at 193 nm was 0.11% (FIG. 3A).

Figure 3B:
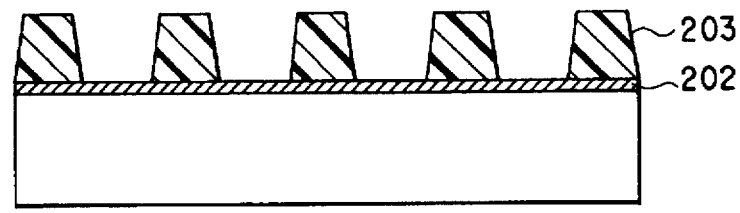
Figure 3C:
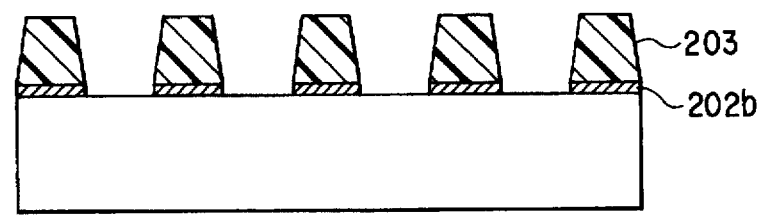

Then, a resist sensitive to 360 nm light and having the thickness of 0.7 μm was formed, a part other than an area where a light screening pattern was to be formed was exposed to the light using a laser patterning apparatus, followed by development to obtain a resist pattern 203 (FIG. 3B).

Figure 3D:
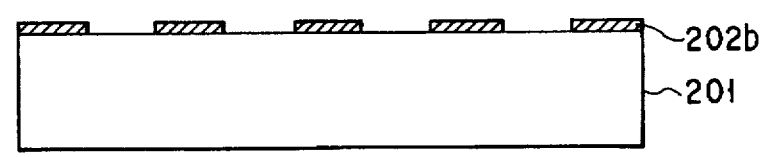

Then, the light screening film was etched using this resist pattern 203 as a mask (FIG. 3C), and the resist pattern 203 was oxidatively removed to form a light screening pattern 202b (FIG. 3D). At this point, the phase difference between an opening and the SiN$_x$O$_y$ pattern was measured to be 96 degree using He—Ne laser.

Figure 4A:
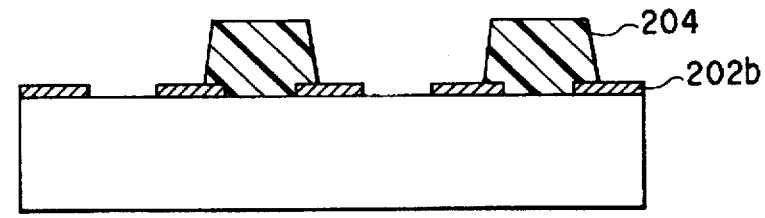
FIGS. 4A to 4D are views illustrating the second half steps for manufacturing the first embodiment of the present mask for light exposure.
Figure 4B:
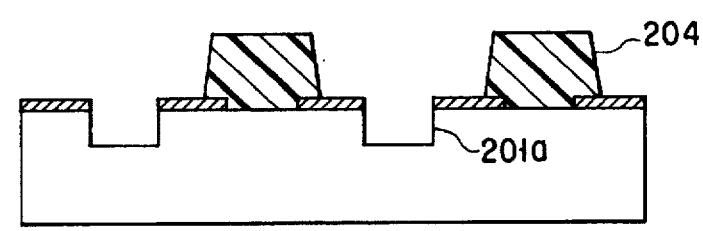

A resist sensitive to 360 nm light and having the thickness of 0.7 μm was further formed on the substrate, and an area where a deeply engraved part was to be formed was exposed to the light using a laser patterning apparatus, followed by development to obtain a resist pattern 204 (FIG. 4A). Then, the light transparent substrate 201 was etched at a phase shift amount using the resist pattern 204 as a mask (FIG. 4B).

Upon this, an engraved amount of the substrate 201 can be accurately controlled at necessary phase shift thickness by measuring the phase difference between the light passing through the light screening pattern 202b and the light passing through an opening thereof using the light having the longer wavelength than that of the original light exposure wavelength for the present mask (for example, He—Ne laser; 633 nm), then stopping etching at a time when the desired phase difference is obtained.

Figure 4C:
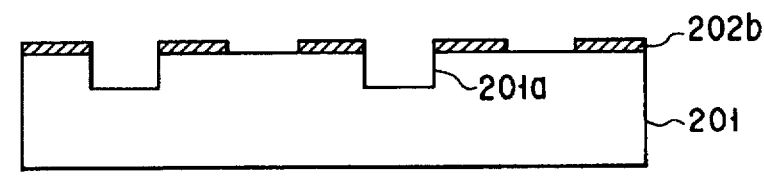
Figure 4D:
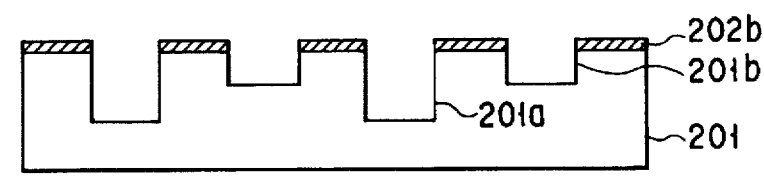

Then the resist pattern 204 was oxidatively removed to form a phase shift pattern 201a (FIG. 4C). Thereafter, openings of the whole surface of the substrate were etched at bias amount to obtained the desired mask for light exposure (FIG. 4D).

Upon this, the engraved amount of the substrate 201 can be accurately controlled at the necessary bias amount by measuring the phase difference between the light passing through the light screening film pattern 202b and the light passing through the opening thereof using the light having the longer wavelength than that of the exposure light as described above, then stopping etching at a time when the measured phase difference becomes the desired value.

With respect to this mask, the difference between the SiN$_x$O$_y$ pattern and the shallowly engraved pattern and that between SiN$_x$O$_y$ pattern and the deeply engraved pattern were measure to be 139.5 degree and 184 degree, respectively, with a phase difference measuring apparatus using He—Ne laser. From these values and previously measured phase shift amount 96 degree of sole SiN$_x$O$_y$ as well as refractive index 1.45 of the light transparent substrate at 633 nm, the depth of the shallowly engraved pattern and that of the deeply engraved pattern were obtained, respectively, as follows:

$$h = 633 \times (139.5 - 96)/\{360 \times (1.45 - 1)\}$$
$$= 170.0 \text{ nm}$$

$$H = 633 \times (184 - 96)/\{360 \times (1.45 - 1)\} = 343.9 \text{ nm}$$

From these values, P are obtained as follows:

$$P = 360 \times (343.9 - 170.0) \times (1.56 - 1)/193$$
$$181.6 \text{ degree}$$

From these results, it was understood that the present mask for light exposure has the phase difference of a range of 180±3 degree and the bias amount approximately equals the phase shifter thickness, which resulted in confirmation that the optical and structural conditions were sufficiently satisfied.

The present mask for light exposure was applied to a mask used for manufacturing a device having the minimum size of 0.13 μm pattern, and it was found that a number of devices having small variations in electrical properties can be manufactured.

In this Example, 633 nm of He—Ne laser was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In this Example, the depth was calculated from the phase difference. However, the depth may be obtained from distortion of an optical image of the measured opening, that is, the difference between defocus position where the image intensity becomes maximum and focus position we well as the pattern size difference at arbitral luminous intensity.

In this Example, $SiN_xO_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for ArF light exposure was manufactured. However, this Examples can be applied to a mask for KrF, I ray or G ray exposure. Further, this Example can be applied to a mask for X ray exposure.

EXAMPLE 2

This Example relates to a Levenson type phase difference shift mask for ArF light exposure. This mask was manufactured according to the same procedures as those in Example 1 except for the use of I ray of mercury as the test wavelength.

A $SiN_xO_y$ light screening film 202 having complex index of refraction of 2.07–0.642i at 193 nm and having the thickness of 160 nm was formed on a light transparent substrate 201. Luminous intensity transmittance of an area where the $SiN_xO_y$ film was formed at 193 nm was 0.11%. After formation of the $SiN_xO_y$ pattern (FIG. 3D), the phase difference between an opening and the $SiN_xO_y$ pattern was measured to be 182 degree using I ray. With respect to a mask for light exposure obtained after final step, the phase difference between the $SiN_xO_y$ pattern and the shallowly engraved pattern and that between the $SiN_xO_y$ pattern and the deeply engraved pattern were measured to be 263 degree and 343 degree, respectively, with a phase difference measuring apparatus using I ray.

From these values as well as the previously measured phase shift amount 96 degree of sole $SiN_xO_y$ and refractive index 1.475 of the light transparent substrate at 365 nm, the depth of the shallowly engraved pattern and that of the deeply engraved pattern were obtained as follows:

$$h = 365 \times (263 - 182)/\{360 \times (1.475 - 1)\}$$
$$= 172.9 \text{ nm}$$
$$H = 365 \times (343 - 182)/\{360 \times (1.475 - 1)\}$$
$$= 343.7 \text{ nm}$$

From these values, the phase difference P was obtained as follows:

$$P = 360 \times (343.7 - 172.9) \times (1.56 - 1)/193$$
$$178.4 \text{ degree}$$

From these results, it was understood that the present mask for light exposure has the phase difference of a range of 180±3 degree and the bias amount approximately equals the phase shifter thickness, which resulted in confirmation that the optical and structural conditions were sufficiently satisfied. The result obtained in this Example is different from that obtained in Example 1 using the wavelength 633 nm and, however, it was found that the accuracy is higher in this Example using the shorter wavelength for measurement than in Example 1 by stepwise measurement with AFM.

The present mask for light exposure was applied to a mask used for manufacturing a device having the minimum size of 0.13 μm pattern, and it was found that a number of devices having small variations in electrical properties can be manufactured.

In this Example, I ray of mercury (365 nm) was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at the phase difference measurement, being desirably not less than 4%.

In this Example, the depth was calculated from the phase difference. However, the depth may be obtained from distortion of an optical image at the measured opening, that is, the difference between defocus position where the image intensity becomes maximum and focus position we well as the pattern size difference at arbitral luminous intensity.

In this Example, $SiN_xO_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength. In this case, the light screening film may be formed by a lamination layer structure of $SiN_xO_y$ having difference compositions, or a combination of $SiN_xO_y$ and $CrO_xO_y$, etc.

In addition, in this Example, a mask for ArF light exposure was manufactured. However, this Example can be applied to a mask for KrF, I ray or G ray exposure. Further, this Example can be applied to a mask for X ray exposure.

EXAMPLE 3

FIGS. 5A to 5E and FIGS. 6A to 6E are cross-sectional views illustrating steps for manufacturing the third embodiment of the present mask for light exposure. This Example relates to a Levenson type phase shift mask for ArF light exposure.

Figure 5A:
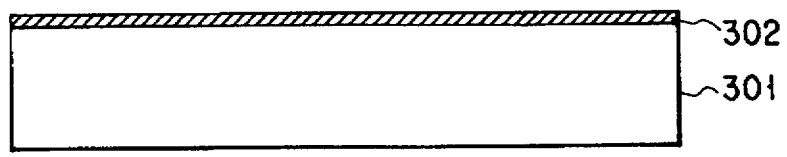
FIGS. 5A to 5E are views illustrating the first half steps for manufacturing the third embodiment of the present mask for light exposure.

Firstly, a chromium oxide nitride ($CrO_xN_y$) light screening film 302 having the thickness of 140 nm was formed on a light transparent substrate 301. Luminous intensity transmittance of a part where this chromium oxide nitride film was formed at 248 nm was 0.08% (FIG. 5A).

Figure 5B:
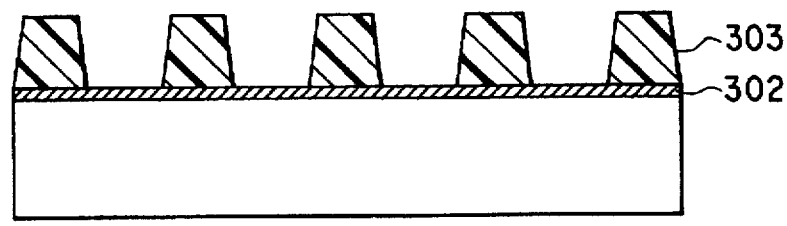
Figure 5C:
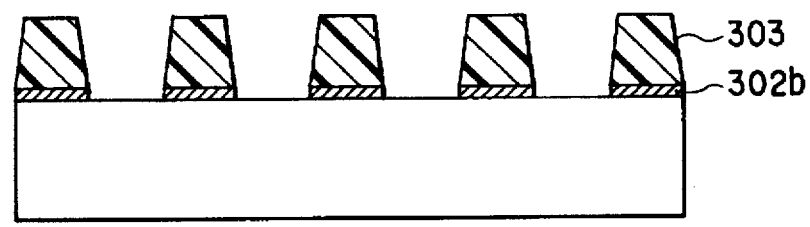

Then, a resist sensitive to 360 nm light and having the thickness of 0.7 μm was formed, a part other than an area where a light screening film pattern was to be formed was exposed to the light using a laser patterning apparatus, followed by development to obtain a resist pattern 303 (FIG. 5B).

Figure 5D:
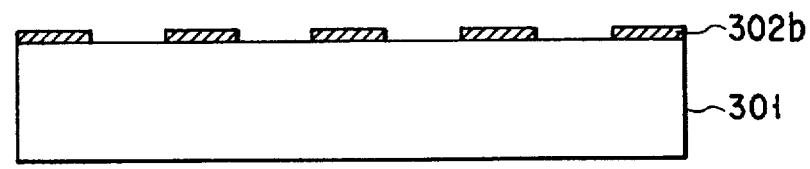

Then, the light screening film was etched using this resist pattern 303 as a mask (FIG. 5C), the resist pattern 303 was oxidatively removed to form a light screening film pattern 302b (FIG. 5D). At this point, the phase difference between an opening and $CrO_xN_y$ pattern was measured to be 161 degree using I ray of mercury.

Figure 5E:
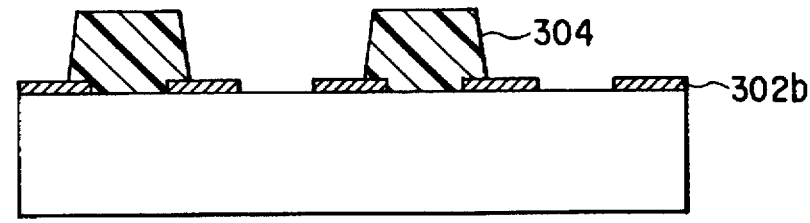

A resist sensitive to 360 nm light and having the thickness of 0.7 μm was further formed on the substrate, and an area where a deeply engraved part was to be formed was exposed to the light using a laser patterning apparatus, followed by development to obtain a resist pattern 304 (FIG. 5E).

Figure 6A:
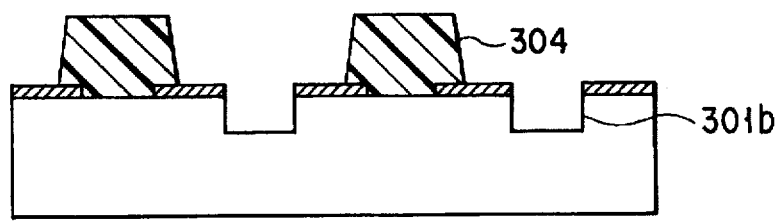
FIGS. 6A to 6E are views illustrating the second half steps for manufacturing the third embodiment of the present mask for light exposure.
Figure 6B:
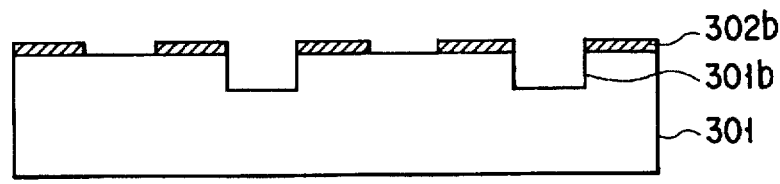

Then, the light transparent substrate 301 was etched at a phase shift amount using the resist pattern 304 as a mask (FIG. 6A). The resist pattern was oxidatively removed to form a phase shift pattern 301a (FIG. 6B).

Figure 6C:
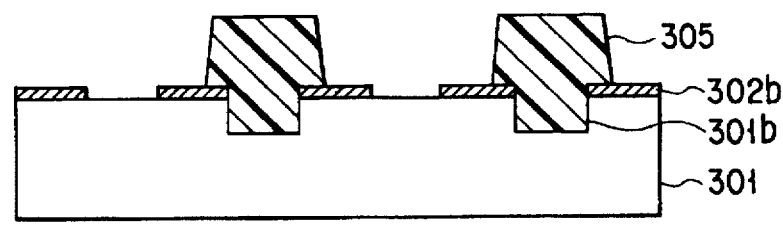

Then, a resist sensitive to 360 nm light having the thickness of 0.7 μm was formed, an area where a deeply engraved part was to be formed was exposed to the light using a laser patterning apparatus, followed by development to obtain a resist pattern 305 (FIG. 6C).

Figure 6D:
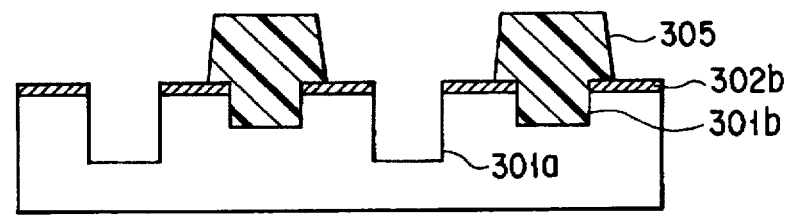
Figure 6E:
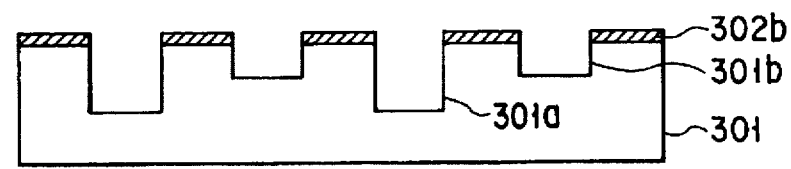

Then, the light transparent substrate 301 was etched using this resist pattern 305 as a mask to obtain a phase shift pattern 301 (FIG. 6D). Then, the resist pattern 305 was oxidatively removed to obtain the desired mask for light exposure (FIG. 6E).

With respect to this mask, the phase difference between chromium oxide nitride ($CrO_xN_y$) pattern and the shallowly engraved pattern and that between chromium oxide nitride ($CrO_xN_y$) pattern and the deeply engraved pattern were measure to be 276 degree and 391 degree, respectively, with a phase difference measuring apparatus using I ray of mercury. From these values as well as the previously measured phase shift amount 161 degree of sole chromium oxide nitride ($CrO_xN_y$) and refractive index 1.475 of the light transparent substrate at I ray of mercury, the depth of the shallowly engraved pattern and that of the deeply engraved pattern were obtained, respectively: h=246 nm, H=491 nm.

From these values, the phase difference P was obtained as follows: P=178.5 degree. From these results, it was understood that the present mask for light exposure has the phase difference of a range of 180±3 degree and the bias amount approximately equals the phase shifter thickness, which resulted in confirmation that the optical and structural conditions were sufficiently satisfied.

The present mask for light exposure was applied to a mask used for manufacturing a device having the minimum size of 0.18 μm pattern, and it was found that a number of devices having small variations in electrical properties can be manufactured.

In this Example, I ray of mercury was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at the phase difference measurement, being desirably not less than 4%.

In this Example, the depth was calculated from phase difference. However, the depth may be obtained from distortion of an optical image at the measured opening, that is, the difference between defocus position where the image intensity becomes maximum and focus position we well as the pattern size difference at arbitral luminous intensity.

In this Example, chromium oxide nitride ($CrO_xN_y$) was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength. In this case, the light screening film may be formed by a lamination film structure of $CrO_xN_y$ having difference compositions.

In addition, in this Example, a mask for KrF light exposure was manufactured. However, this Example can be applied to a mask for ArF light exposure. Further, this Example can be applied to a mask for X-ray exposure. This Example can be applied to a mask for I ray and G ray exposure when He—Ne laser (633 nm) is used as the test wavelength.

In this Example, the depth of 301a pattern and that of 301b pattern were measured after manufacture of the mask for light exposure. However, the phase difference and the bias amount may be obtained by measuring the depth of 301b pattern after formation of 301b pattern (step: FIG. 6B), and the depth of 301a pattern after step: FIG. 6D.

EXAMPLE 4

FIGS. 7A to 7E and FIGS. 8A to 8E are cross-sectional views illustrating steps for manufacturing the fourth embodiment of the present mask for light exposure. This Example relates to a Levenson type phase shift mask for ArF light exposure.

Figure 7A:
FIGS. 7A to 7E are views illustrating the first half steps for manufacturing the fourth embodiment of the present mask for light exposure.

Firstly, a molybdenum oxide silicide ($MoSiO_y$) light screening film 402 having the thickness of 220 nm was formed on a light transparent substrate 401. Luminous intensity transmittance of a part where this $MoSiO_y$ film was formed at 193 nm was 0.11% (FIG. 7A).

Figure 7B:
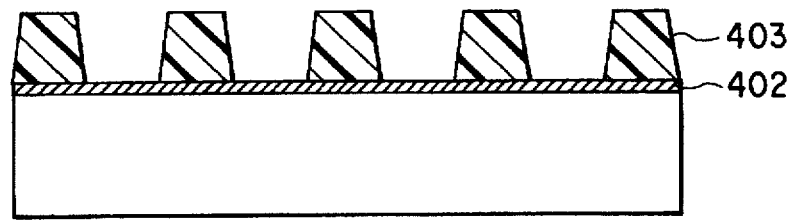
Figure 7C:
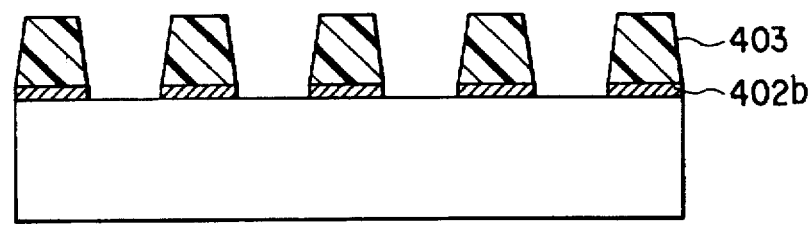

Then, a resist sensitive to 360 nm light and having the thickness of 0.7 μm was formed, a part other than an area where a light screening film pattern was to be formed was exposed to the light using a laser patterning apparatus, followed by development to obtain a resist pattern 403 (FIG. 7B).

Figure 7D:
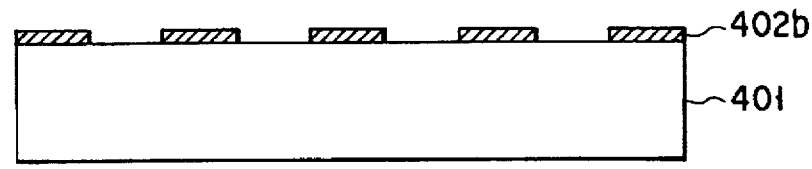

Then, the light screening film was etched using this resist pattern 403 as a mask (FIG. 7C), the resist pattern 403 was oxidatively removed to form a light screening film pattern 402b (FIG. 7D). At this point, the phase difference between an opening and MoSiO$_y$ pattern was measured to be 69 degree using He—Ne laser.

Figure 7E:
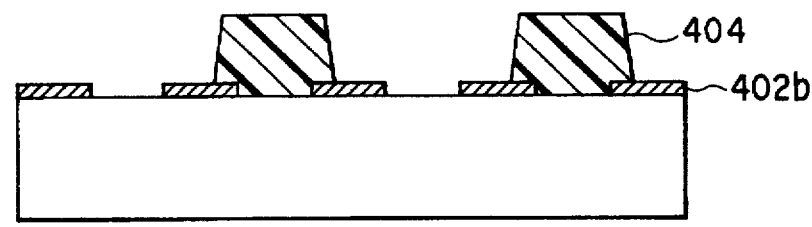

A resist sensitive to 360 nm light and having the thickness of 0.7 μm was further formed on the substrate, and an area where a deeply engraved part was to be formed was exposed to the light using a laser patterning apparatus, followed by development to obtain a resist pattern 404 (FIG. 7E).

Figure 8A:
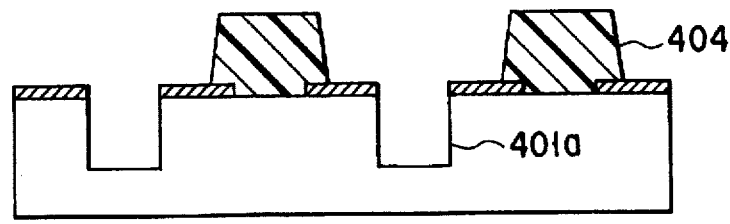
FIGS. 8A to 8E are views illustrating the second half steps for manufacturing the fourth embodiment of the present mask for light exposure.
Figure 8B:
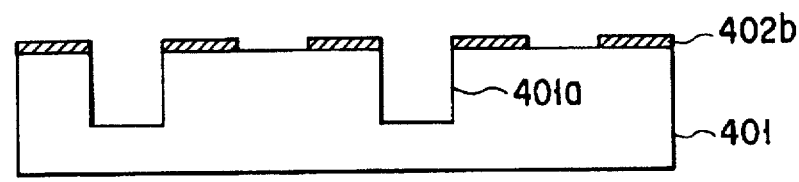

Then, the light transparent substrate 401 was etched at a phase shift amount using the resist pattern 404 as a mask (FIG. 8A). The resist pattern was oxidatively removed to form a phase shift pattern 401a (FIG. 8B).

Figure 8C:
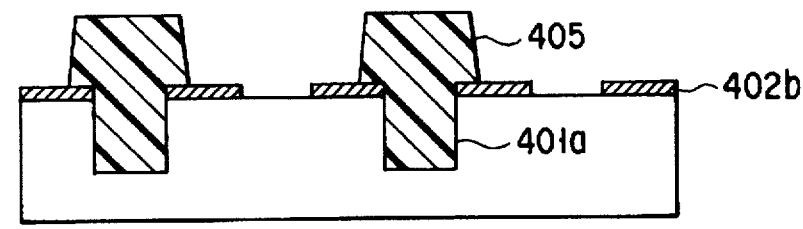
Figure 8D:
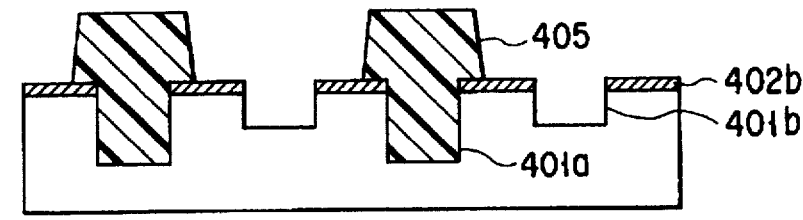
Figure 8E:
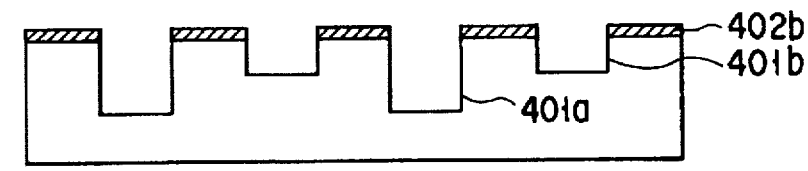

Then, a resist sensitive to 360 nm light having the thickness of 0.7 μm was formed, an area where a deeply engraved part was to be formed was exposed to the light using a laser patterning apparatus, followed by development to obtain a resist pattern 405 (FIG. 8C). Then, the light transparent substrate 301 was etched using this resist pattern 405 as a mask to obtain a phase shift pattern 401 (FIG. 8D). Then, the resist pattern 405 was oxidatively removed to obtain the desired mask for light exposure (FIG. 8E).

With respect to this mask, the difference between MoSiO$_y$ pattern and the shallowly engraved pattern and that between MoSiO$_y$ pattern and the deeply engraved pattern were measure to be 113 degree and 158 degree, respectively, with a phase difference measuring apparatus using He—Ne laser. From these values as well as the previously measured phase shift amount 69 degree of sole MoSiO$_y$ and refractive index 1.45 of the light transparent substrate at 633 nm, the depth of the shallowly engraved pattern and that of the deeply engraved pattern were obtained, respectively: h=172 nm, H=347 nm. From these values, the phase difference P was obtained as follows: P=183 degree.

From these results, it was understood that the present mask for light exposure has the phase difference of a range of 180±3 degree and the bias amount approximately equals the phase shifter thickness, which resulted in confirmation that the optical and structural conditions were sufficiently satisfied.

The present mask for light exposure was applied to a mask used for manufacturing a device having the minimum size of 0.18 μm pattern, and it was found that a number of devices having small variations in electrical properties can be manufactured.

In this Example, 633 nm of He—Ne was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In this Example, the depth was calculated from phase difference. However, the depth may be obtained from distortion of an optical image of measured opening, that is, the difference between defocus position where the image intensity becomes maximum and focus position we well as the pattern size difference at arbitral luminous intensity.

In this Example, MoSiO$_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength. In this case, the light screening film may be formed by a lamination film structure having difference compositions.

In addition, in this Example, a mask for KrF light exposure was manufactured. However, this Example can be applied to a mask for ArF, I ray and G ray exposure. Further, this Example can be applied to a mask for X-ray exposure.

In this Example, the depth of 401a pattern and that of 401b pattern were measured after manufacture of the mask for light exposure. However, the phase difference and the bias amount may be obtained by measuring the depth of 401b pattern after formation of 401b pattern (step: FIG. 8B), and the depth of 401a pattern after step: FIG. 8E.

EXAMPLE 5

FIGS. 9A to 9D and FIGS. 10A to 10D are cross-sectional views illustrating steps for manufacturing the third embodiment of the present mask for light exposure. This Example relates to a Levenson type phase shift mask for KrF light exposure.

Firstly, a silicon nitride (SiN$_y$) light screening film 502 having the thickness of 140 nm was formed on a light transparent substrate 501. Luminous intensity transmittance of a part where this silicon nitride film was formed at 284 nm was 0.1% (FIG. 9A).

Then, a resist sensitive to 360 nm light and having the thickness of 0.7 μm was formed, a part other than an area where a light screening film pattern was to be formed was exposed to the light using a laser patterning apparatus, followed by development to obtain a resist pattern 503 (FIG. 9B).

Then, the light screening film was etched using this resist pattern 503 as a mask (FIG. 9C), the resist pattern 503 was oxidatively removed to form a light screening film pattern 502b (FIG. 9D). At this point, the phase difference between an opening and SiN$_x$ pattern was measured to be 200 degree using I ray of mercury.

Then, openings of the whole surface of the substrate were etched at a the bias amount to form 501a and 502b patterns having the same depth (FIG. 10A).

A resist sensitive to 360 nm light and having the thickness of 0.7 μm was further formed on the substrate, and an area where a deeply engraved part was to be formed was exposed to the light using a laser patterning apparatus, followed by development to obtain a resist pattern 504 (FIG. 10B).

Then, only 501a pattern of the light transparent substrate was etched at the phase difference using this resist pattern 504 as a mask (FIG. 10C), and the resist pattern 504 was oxidatively removed to obtain the desired mask for light exposure (FIG. 10D).

With respect to this mask, the difference between SiN$_x$ pattern and the shallowly engraved pattern and that between SiN$_x$ pattern and the deeply engraved pattern were measure to be 313 degree and 430 degree, respectively, with a phase difference measuring apparatus using I ray of mercury. From these values as well as the previously measured phase shift amount 200 degree of sole SiN$_x$ and refractive index 1.475 of the light transparent substrate at I ray of mercury, the depth of the shallowly engraved pattern and that of the deeply engraved pattern were obtained, respectively, as follows: h=246 nm, H=491 nm. From these values, the phase difference P was obtained as follows: P=178.5 degree.

From these results, it was understood that the present mask for light exposure has the phase difference of a range of 180±3 degree and the bias amount approximately equals the phase shifter thickness, which resulted in confirmation that the optical and structural conditions were sufficiently satisfied.

The present mask for light exposure was applied to a mask used for manufacturing a device having the minimum size of 0.18 μm pattern, and it was found that a number of devices having small variations in electrical properties can be manufactured.

In this Example, I ray of mercury was used as the wavelength for measuring the phase difference. However, any wavelength can be used which is longer than the light exposure wavelength and which the light screening film used for at the light exposure wavelength transmits. In addition, the transmittance of the light transparent area may be any which can assure the accuracy at phase difference measurement, being desirably not less than 4%.

In this Example, the depth was calculated from phase difference. However, the depth may be obtained from distortion of an optical image of measured opening, that is, the difference between defocus position where the image intensity becomes maximum and focus position we well as the pattern size difference at arbitral luminous intensity.

In this Example, silicon nitride ($SiN_x$) was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for KrF light exposure was manufactured. However, this Example can be applied to a mask for ArF light exposure. This Example can be also applied to a mask for X-ray exposure. In addition, this Example can be applied to a mask for I ray and G ray exposure when He—Ne laser (633 nm) is used as the test wavelength.

In this Example, the depth of 501a pattern and that of 501b pattern were measured after manufacture of the mask for light exposure. However, the phase difference and the bias amount may be obtained by measuring the depth of 501b pattern after formation of 501b pattern (step: FIG. 10A), and the depth of 501a pattern after step: FIG. 10D.

EXAMPLE 6

FIGS. 11A to 11E and FIGS. 12A to 12D are cross-sectional views illustrating steps for manufacturing the third embodiment of the present mask for light exposure. This Example relates to a Levenson type phase shift mask for ArF light exposure. The mask is so manufactured as to engrave openings alternately at different depth.

Figure 11A:
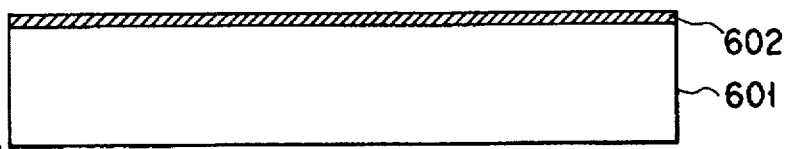
FIGS. 11A to 11E are views illustrating the first half steps for manufacturing the sixth embodiment of the present mask for light exposure.

Firstly, a $SiN_xO_y$ light screening film 602 having the complex index of refraction of 2.08–0.81i and having the thickness of 180 nm was formed on a light transparent substrate 601 (FIG. 11A). Luminous intensity transmittance of a part where $SiN_xO_y$ film was formed at 193 nm was 0.01%.

Figure 11B:
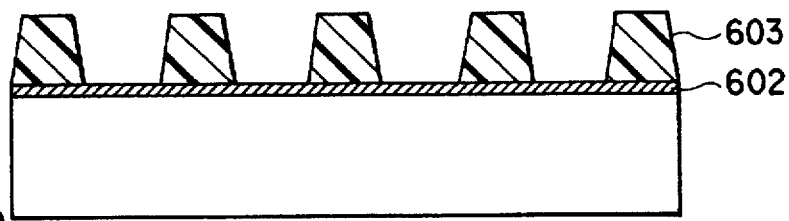
Figure 11C:
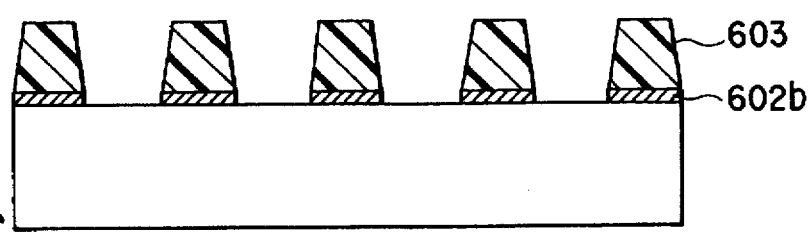

Then, a resist sensitive to 360 nm light and having the thickness of 0.7 μm was formed, a part other than an area where a light screening film pattern was to be formed was exposed to the light using a laser patterning apparatus, followed by development to obtain a resist pattern 603 (FIG. 11B).

Figure 11D:
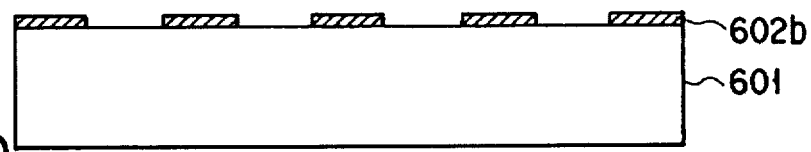
Figure 11E:
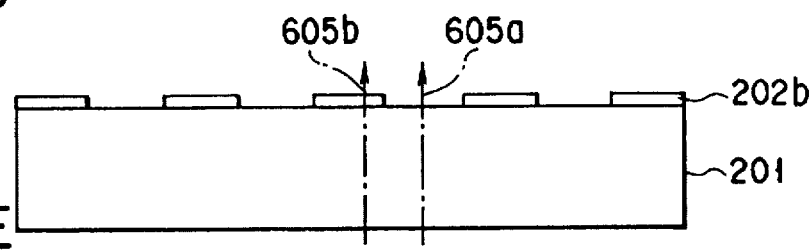

Then, the light screening film was etched using this resist pattern as a mask (FIG. 11C), and the resist pattern was oxidatively removed to form a light screening film pattern 602b (FIG. 11D). At this point, the phase difference between the measurement light 605a passing though an opening and the measurement light 605b passing through $SiN_xO_y$ pattern was measured to be 327.6 degree using I ray of mercury lamp, as described in FIG. 11E. In addition, the transmittance of the light screening film at this wavelength was 4%. Upon measurement, the pattern size was adjusted so that an opening of $SiN_xO_y$ pattern became slightly wider at an area to be engraved by etching.

Figure 12A:
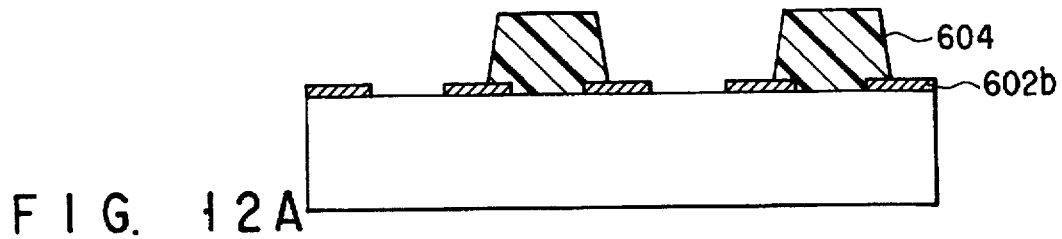
FIGS. 12A to 12D are views illustrating the second half steps for manufacturing the sixth embodiment of the present mask for light exposure.
Figure 12B:
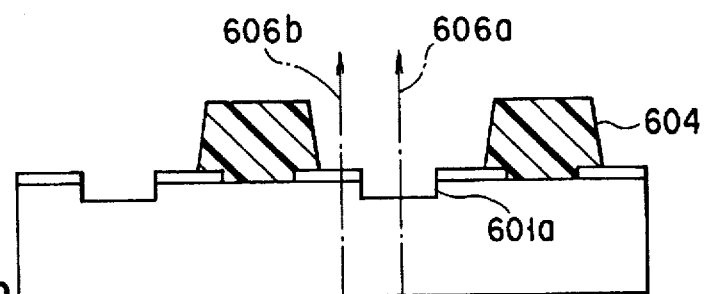
Figure 12C:
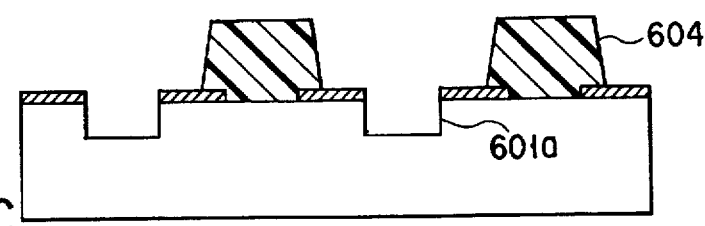

A resist sensitive to 360 nm light and having the thickness of 0.7 μm was further formed this substrate, an area where a part to be deeply engraved was to be formed was exposed to the light using a laser patterning apparatus, followed by development to obtain a resist pattern 604 (FIG. 12A). The light transparent substrate was etched at a phase shift amount using this resist pattern as a mask (FIG. 12B).

Figure 12D:
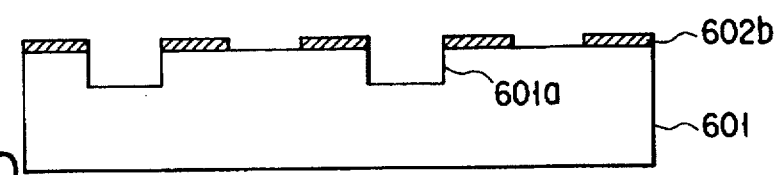
Figure 13:
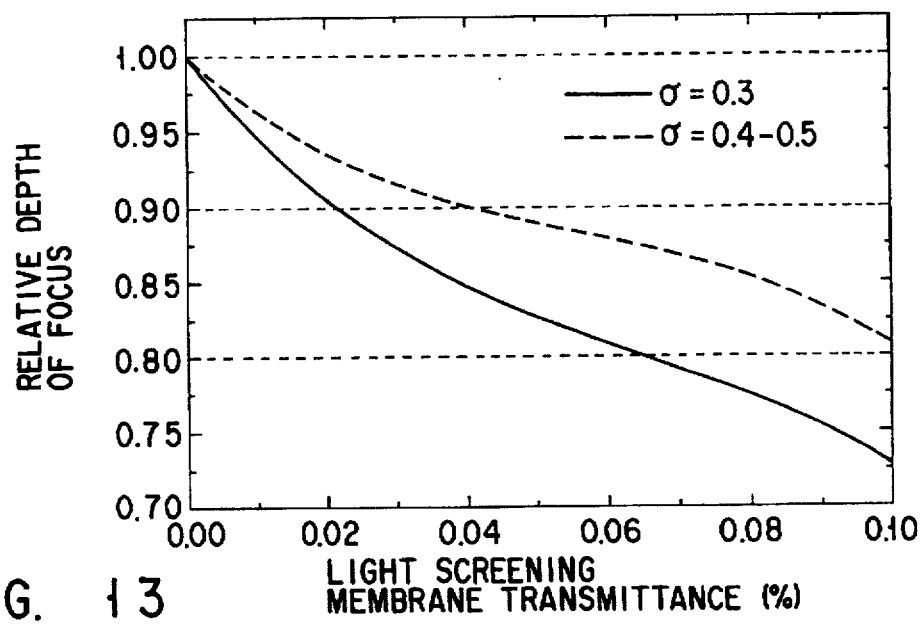
FIG. 13 is a view showing the deterioration degree of the depth of focus relative to the light screening film transmittance.

Upon this, an engraved amount of the substrate was accurately controlled at the necessary phase shifter thickness by measuring the phase difference between the light passing through the light screening film pattern 606b and the light passing through the opening 606a thereof using the light having the longer wavelength than that of the original exposure light for the present embodiment mask (for example, I ray of mercury) (FIG. 12C), then stopping etching at a time when the measured phase difference became the desired one (FIG. 12D).

With respect to this mask, the difference between $SiN_xO_y$ pattern and the engraved pattern was measured to be 406.7 degree with a phase difference measuring apparatus using I ray of mercury. From these values as well as the previously measured phase shift amount 327.6 degree of sole $SiN_xO_y$ and refractive index 1.475 of the light transparent substrate at 365 nm, the depth engraved pattern was obtained as follows:

$$h = 365 \times (406.7 - 327.6)/\{360 \times (1.475 - 1)\}$$
$$= 169.0 \text{ nm}$$

From these values, the phase difference P was obtained as follows:

$$P=360 \times 169.0 \times (1.56-1)/193=176.5 \text{ degree.}$$

From these results, it was understood that the present mask for light exposure has the phase difference of a range of 174±3 degree relative to the desired phase difference 174 degree and the bias amount approximately equals the phase shifter thickness, which resulted in confirmation that the optical and structural conditions were sufficiently satisfied.

When correction is not applied to the size of the engraved part, a quartz substrate can be isotopically etched with ammonium fluoride to obtain the desired mask for light exposure.

The present mask for light exposure was applied to a mask used for manufacturing a device having the minimum size of 0.13 μm pattern, and it was found that a number of devices having small variations in electrical properties can be manufactured.

In this Example, I ray of mercury (365 nm) was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In addition, the light screening film and the opening are not necessarily adjacent to each other.

In this Example, the depth was calculated from the phase difference. However, the depth may be obtained from distortion of an optical image of the measured opening, that is, the difference between defocus position where the image intensity becomes maximum and focus position we well as the pattern size difference at arbitral luminous intensity.

In this Example, $SiN_xO_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for ArF light exposure was manufactured. However, this Example can be applied to a mask for KrF, I ray and G ray exposure, further to a mask for X-ray exposure. In the mask for I ray (365 nm) exposure, the light having the longer wavelength than that of I ray such as G ray (436 nm) and Ar laser (488 nm) may be used in place of I ray employed for measuring the phase difference in this Example. In the mask for G ray exposure, the light having the longer wavelength than that of G ray such as E ray, Ar laser (488 nm and 515 nm) and He—Ne (623 nm) can be used.

EXAMPLE 7

This Example relates to a mask for ArF light exposure which can be manufactured according to the same procedures as those of Example 2 with the proviso that target phase difference (phase difference between a deeply engraved part and a shallowly engraved part) and target bias amount (phase difference between a shallowly engraved part and non-engraved area of a light transparent substrate) are both 174 degree, in view of image quality deterioration caused in a quartz wall after etching process. The mask is so manufactured as to engrave openings alternately at different degree (regarding manufacturing procedures, see FIG. 3A to FIG. 3D and FIGS. 4A to 4D).

A $SiN_xO_y$ light screening film 202 having the complex index of refraction of 2.08–0.81i at 193 nm and having the thickness of 180 nm was formed on a light transparent substrate 201. Luminous intensity transmittance of a part where $SiN_xO_y$ film was formed at 193 nm was 0.01%. After formation of $SiN_xO_y$ pattern (FIG. 3D), the phase difference between an opening and the $SiN_xO_y$ pattern was measured to be 327.6 degree using I ray. With respect to a mask for light exposure after final step, the phase difference between the $SiN_xO_y$ pattern and a shallowly engraved pattern and that between the $SiN_xO_y$ pattern and a deeply engraved pattern were measured to be 405.4 degree and 482.9 degree, respectively, with a phase difference measuring apparatus using I ray.

From these values as well as the previously measured phase shift amount 96 degree of sole $SiN_xO_y$ and refractive index 1.475 of the light transparent substrate at 365 nm, the depth of the shallowly engraved pattern and that of the deeply engraved pattern were obtained, respectively, as follows:

$$h = 365 \times (405.4 - 327.6)/\{360 \times (1.475 - 1)\}$$
$$= 166.1 \text{ nm}$$
$$H = 365 \times (482.9 - 327.6)/\{360 \times (1.475 - 1)\}$$
$$= 331.5 \text{ nm}$$

From these values, the phase difference P was obtained as follows:

$$P = 360 \times (331.5 - 166.1) \times (1.56 - 1)/193$$
$$172.8 \text{ degree.}$$

From these results, it was understood that the present mask for light exposure has the phase difference of a range of 174±3 degree and the bias amount approximately equals the phase shifter thickness, which resulted in confirmation that the optical and structural conditions were sufficiently satisfied. The result obtained in this Example is different from that of Example 1 using the wavelength 633 nm. However, it was found that the accuracy is higher in this Example using the shorter wavelength, as measured by stepwise measurement with AFM.

The present mask for light exposure was applied to a mask used for manufacturing a device having the minimum size of 0.11 μm pattern, and it was found that a number of devices having small variations in electrical properties can be manufactured.

In this Example, I ray of mercury (365 nm) was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In this Example, the depth was calculated from the phase difference. However, the depth may be obtained from distortion of an optical image of the measured opening, that is, the difference between defocus position where the image intensity becomes maximum and focus position we well as the pattern size difference at arbitral luminous intensity.

In this Example, $SiN_xO_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for ArF light exposure was manufactured. However, this Example can be applied to a mask for KrF, I ray and G ray exposure, further to a mask for X-ray exposure.

EXAMPLE 8

This Example relates to a mask for ArF light exposure which can be manufactured according to the same procedures as those of Example 3 with the proviso that target phase difference (phase difference between a deeply engraved part and a shallowly engraved part) and target bias amount (phase difference between a shallowly engraved part and non-engraved area of a light transparent substrate) are both 174 degree, in view of image quality deterioration caused in a quartz wall after etching process. The mask is so manufactured as to engrave openings alternately at different degree (regarding manufacturing procedures, see FIG. 5A to FIG. 5E and FIGS. 6A to 6E).

Firstly, a chromium oxide nitride ($CrO_xN_y$) light screening film 302 having the thickness of 170 nm was formed on a light transparent substrate 301. Luminous intensity transmittance of a part where chromium oxide nitride film was formed at 248 nm was 0.01% (FIG. 5A).

Then, a resist sensitive to 360 nm light and having the thickness of 0.7 μm was formed, a part other than an area where a light screening pattern was to be formed was exposed to the light using a laser patterning apparatus, followed by development to obtain a resist pattern 303 (FIG. 5B).

Then, the light screening film was etched using this resist pattern 303 as a mask (FIG. 5C), and the resist pattern 303 was oxidatively removed to obtain a light screening pattern 302b (FIG. 5D). At this point, the phase difference between an opening and $CrO_xN_y$ pattern was measured to be 200.4 degree.

A resist sensitive to 360 nm light and having the thickness of 0.7 μm was further formed on this substrate, an area where a deeply engraved part was to be formed was exposed to the light using a laser patterning apparatus, followed by development to obtain a resist pattern 304 (FIG. 5E).

Then, the light transparent substrate 301 was etched at a phase shift amount using this resist pattern 304 as a mask (FIG. 6A). Upon this, an etched amount was determined by measuring the phase difference between the light screening film ($CrO_xN_y$) and an etched part with a phase difference measuring apparatus using wavelength 365 nm, and etching was stopped when the phase difference became approximately the desired value (312.7 degree). The actual phase difference was 311.6 degree, and the resist pattern was oxidatively removed to obtain a phase shift pattern 301b. (FIG. 6B).

Then, a resist sensitive to 360 nm light and having the thickness of 0.7 μm was formed, an area where a deeply engraved part was to be formed was exposed to the light using a laser patterning apparatus, followed by development to obtain a resist pattern 305 (FIG. 6C).

Then, the light transparent substrate 301 was etched using this resist pattern 305 as a mask to obtain a phase shift pattern 301 (FIG. 6D). Upon this, an etched amount was determined by measuring the phase difference between the light screening film ($CrO_xN_y$) and a shallowly engraved part with a phase difference measuring apparatus using wavelength 365 nm, and etching was stopped when the phase difference became approximately the desired value (312.7 degree). The actual phase difference was 312.7 degree. In addition, the phase difference between the deeply engraved part and the light screening film was 423.5 degree. The resist pattern 305 was oxidatively removed to obtain the desired mask for light exposure (FIG. 6E).

From these values as well as the previously measured phase shift amount 200.4 degree of sole chromium oxide nitride ($CrO_xN_y$) and refractive index 1.475 of the light transparent substrate at I ray of mercury, the depth of the shallowly engraved pattern and that of the deeply engraved pattern were obtained, respectively, as follows: h=476.2 nm and H=239.7 nm.

From these values, the phase difference P was obtained as follows: P=171.7. In addition, the bias amount was 174.3 degree. From these results, it was understood that the present mask for light exposure has the phase difference of a range of 174±3 degree and the bias amount approximately equals the phase shifter thickness, which resulted in confirmation that the optical and structural conditions were sufficiently satisfied.

The present mask for light exposure was applied to a mask used for manufacturing a device having the minimum size of 0.15 μm pattern, and it was found that a number of devices having small variations in electrical properties can be manufactured.

In this Example, I ray of mercury was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In this Example, the depth was calculated from phase difference. However, the depth may be obtained from distortion of an optical image of the measured opening, that is, the difference between defocus position where the image intensity becomes maximum and focus position we well as the pattern size difference at arbitral luminous intensity.

In this Example, chromium oxide nitride ($CrO_xN_y$) was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for KrF light exposure was manufactured. However, this Example can be applied to a mask for ArF light exposure, further to a mask for X-ray exposure. In addition, this Example can be applied to a mask for I ray and G ray exposure, when He—Ne laser (633 nm) is used as the test wavelength.

In this Example, the depth of 301a pattern and that of 301b pattern were measured after manufacture of the mask for light exposure. However, the phase difference and the bias amount may be determined by measuring the depth of 301b pattern after formation of 301b pattern (Step: FIG. 6B), and the depth of 301a pattern after step: FIG. 6E.

EXAMPLE 9

This Example relates to a mask for ArF light exposure which can be manufactured according to the same procedures as those of Example 4 with the proviso that target phase difference (phase difference between a deeply engraved part and a shallowly engraved part) is 174 degree and target bias amount (phase difference between a shallowly engraved part and non-engraved area of a light transparent substrate) is 180 degree, in view of image quality deterioration caused in a quartz wall after etching process. The mask is so manufactured as to engrave openings alternately at different degree (regarding manufacturing procedures, see FIGS. 7A to 7E and FIGS. 8A to 8E).

Firstly, a molybdenum oxide silicide ($MoSiO_y$) light screening film 402 having the thickness of 210 nm was formed on a light transparent substrate 401. Luminous intensity transmittance of a part where this $MoSiO_y$ film was formed at 193 nm was 0.01% (FIG. 7A).

Then, a resist sensitive to 360 nm light and having the thickness of 0.7 μm was formed, a part other than an area where a light screening pattern was to be formed was exposed to the light using a laser patterning apparatus, followed by development to obtain a resist pattern 403 (FIG. 7B).

Then, the light screening film was etched using this resist pattern 403 as a mask (FIG. 7C), and the resist pattern 403 was oxidatively removed to obtain a light screening pattern 402b (FIG. 7D). At this point, the phase difference between an opening and MoSiO$_y$ pattern was measured to be 69.3 degree.

A resist sensitive to 360 nm light and having the thickness of 0.7 μm was further formed on this substrate, an area where a deeply engraved part was to be formed was exposed to the light using a laser patterning apparatus, followed by development to obtain a resist pattern 404 (FIG. 7E).

Then, the light transparent substrate 401 was etched to provide a phase shift using this resist pattern 404 as a mask (FIG. 8A). The resist pattern was oxidatively removed to obtain a phase shift pattern 401a (FIG. 8B).

Then, a resist sensitive to 360 nm light and having the thickness of 0.7 μm was formed, an area where a deeply engraved part was to be formed was exposed to the light using a laser patterning apparatus, followed by development to obtain a resist pattern 405 (FIG. 8C). Then, the light transparent substrate 301 was etched using this resist pattern 405 as a mask to obtain a phase sift pattern 401 (FIG. 8D). Then, the resist pattern 405 was oxidatively removed to obtain the desired mask for light exposure (FIG. 8E).

With respect to this mask, the phase difference between MoSiO$_y$ pattern and the shallowly engraved pattern and that between MoSiO$_y$ pattern and the deeply engraved part were measured to be 127.9 degree and 184.2 degree, respectively. From these values as well as the previously measured phase shift amount 69.3 degree of sole MoSiO$_y$ and refractive index 1.46 of the light transparent substrate at 488 nm, the depth of the shallowly engraved pattern and that of the deeply engraved pattern were obtained, respectively, as follows: h=172.7 nm and H=338.6 nm. From these values, the phase difference P was obtained as follows: P=173.3. In addition, the phase difference of the shallowly engraved light transparent substrate relative to non-processed area (bias amount) was 180.4 degree.

From these results, it was understood that the present mask for light exposure has the phase difference of a range of 174±3 degree and the bias amount is in a range of 180±3 degree, which resulted in confirmation that the optical and structural conditions were sufficiently satisfied.

The present mask for light exposure was applied to a mask used for manufacturing a device having the minimum size of 0.18 μm pattern, and it was found that a number of devices having small variations in electrical properties can be manufactured. Further, the mask for light exposure obtained in this Example was applied to the device described in Example 3, and it was found that wider focus tolerance was obtained.

In this Example, 488 nm of Ar laser was used as the wavelength for measuring the phase difference. However, any wavelength can be used which is longer than the light exposure wavelength and which the light screening film used at the light exposure wavelength transmits. In addition, the transmittance of the light transparent area may be any which can assure the accuracy at phase difference measurement, being desirably not less than 4%.

In this Example, the depth was calculated from phase difference. However, the depth may be obtained from distortion of an optical image of the measured opening, that is, the difference between defocus position where the image intensity becomes maximum and focus position we well as the pattern size difference at arbitral luminous intensity.

In this Example, MoSiO$_y$ was used as a light screening film to the light exposure wavelength. However, in addition to the above compound, any film can be used which is composed of any one of silicon, germanium, gallium arsenide, titanium, aluminum, chromium, tin, indium, nickel, cobalt, tantalum, hafnium, metal silicide, amorphous carbon and tungsten, or composed of oxide, nitride, hydride, carbide or halide thereof, or a mixture thereof, and has the light screening properties at the light exposure wavelength and has the transparency at the test wavelength.

In addition, in this Example, a mask for ArF light exposure was manufactured. However, this Example can be applied to a mask for KrF, I ray and G ray light exposure, further to a mask for X-ray exposure.

In this Example, the depth of 401a pattern and that of 401b pattern were measured after manufacture of the mask for light exposure. However, the phase difference and the bias amount may be determined by measuring the depth of 401b pattern after formation of 401b pattern (Step: FIG. 8B), and the depth of 401a pattern after step: FIG. 8E.

What is claimed is:

1. A mask for light exposure which is provided with a light transparent substrate and a mask pattern formed on said light transparent substrate, said mask pattern comprising a light screening pattern composed of material which screens the exposure light and transmits a phase measuring light having a wavelength longer than that of the exposure light and a phase shift pattern formed by engraving a part of the light transparent substrate.

2. The mask for light exposure according to claim 1, wherein the light screening pattern is formed on the light transparent substrate and is composed of a material which screens the exposure light and transmits at least a part of the light having the longer wavelength than that of the exposure light and shorter than 700 nm.

3. The mask for light exposure according to claim 1, wherein the light transparent substrate is engraved at two depths and has the phase difference of approximate 180 degree relative to the exposure light due to the difference between two kinds of engraved amounts.

4. The mask for light exposure according to claim 1, wherein the light transparent substrate is engraved at one or more depths, and the light passing through at least a part of the engraved part produces the optical path difference relative to the exposure light passing through a non-processed area of the light transparent substrate.

5. The mask for light exposure according to claim 1, wherein the light transparent substrate is engraved to at least two depths, and the difference between respective engraved depths of the engraved parts is approximately equal to the engraved depth of the more shallow of the two engraved parts.

6. The mask for light exposure according to claim 1, wherein the light screening pattern having the light screening properties at the light exposure wavelength has a transmittance of at least 4%.

7. The mask for light exposure according to claim 1, wherein the transmittance of the light screening pattern having the light screening properties is not greater than 0.1% at the light exposure wavelength.

8. The mask for light exposure according to claim 1, wherein the pattern having the light screening properties at the light exposure wavelength is composed of any one of silicon, germanium, gallium arsenide, titanium, aluminum, chromium, tin, indium, nickel, cobalt, tantalum, hafnium, metal silicide, amorphous carbon and tungsten.

9. The mask for light exposure according to claim 1, wherein the pattern having the light screening properties at the light exposure wavelength is composed of oxide, nitride, hydride, carbide or halide of silicon, germanium, gallium arsenide, titanium, aluminum, chromium, tin, indium, nickel, cobalt, tantalum, hafnium, metal silicide, amorphous carbon and tungsten.

10. The mask for light exposure according to claim 1, wherein the pattern having the light screening properties at the light exposure wavelength is composed of a mixture of compounds of at least two of which are selected from a group of silicon, germaniun, gallium arsenide, titanium, aluminum, chromium, tin, indium, nickel, cobalt, tantalum, hafnium, metal silicide, amorphous carbon and tungsten.

11. In a method for production of a mask for light exposure provided with a light transparent substrate and a mask pattern formed on the light transparent substrate, said mask pattern comprising a light screening pattern composed of a material which screens the exposure light and transmits the light having the longer wavelength than that of the exposure light and a phase shift pattern formed by engraving a part of the light transparent substrate, said process comprising calculating an etched depth of the light transparent substrate by determining the optical image of the light passing through the light screening pattern and the light passing through an opening of the light screening pattern or determining the phase difference between said two kinds of lights using the phase measuring light having the longer wavelength than that of the exposure light.

12. The process for production of a mask for light exposure according to claim 11, wherein the light screening pattern is formed on the light transparent substrate and is composed of a material which screens the exposure light and transmits at least a part of the light having the longer wavelength than that of the exposure light and shorter than 700 nm.

13. The process for production of a mask for light exposure according to claim 11, wherein the phase difference is calculated from the measured value of the optical path difference between the light passing through the light screening pattern and the light passing through an opening of the light screening pattern.

14. The process for production of a mask for light exposure according to claim 11, wherein the phase difference is calculated from a changed amount of focus position of the light passing through the opening of the light screening pattern in an optical image at virtual non-transferred substrate plane.

15. The process for production of a mask for light exposure according to claim 11, wherein the step of measuring the phase difference (optical path difference) is carried out on the individual patterns having different engraved amount from that of the light screening pattern and an area of the light transparent substrate to be not engraved, using the light having the longer wavelength than that of the exposure light, and the engraved amount of the individual patterns or the phase difference is obtained from the difference between respective optical paths and the wavelength used for measuring the optical path, refractive index at the wavelength for measuring the optical path, the wavelength of the light exposure, and refractive index of the light transparent substrate at the wavelength of the light exposure.

16. In a method for production of a mask for light exposure provided with a light transparent substrate and a mask pattern, formed on said light transparent substrate, comprising a light screening pattern and a phase shift pattern formed by engraving a part of the light transparent substrate, said process comprising the following steps:

a step of forming the light screening pattern composed of a material which screens the exposure light and transmits a phase measuring light having a longer wavelength than that of the exposure light, on the light transparent substrate, a step of etching the substrate using the light screening pattern and a resist as a mask while selectively masking an opening of the light screening pattern and determining the phase difference between the light passing through the light screening pattern and the light passing through the opening of the light screening pattern using the phase measuring light having the longer wavelength than that of the exposure light, then stopping etching at a time when the desired phase difference is obtained, and a step of removing the resist.

17. The process for production of a mask for light exposure according to claim 16, wherein the step of forming the light screening pattern is carried out by forming a light screening pattern, on the light transparent substrate, composed of a material which screens the exposure light and transmits at least a part of a phase measuring light having the longer wavelength than that of the exposure light and shorter than 700 nm.

18. The process for production of a mask for light exposure according to claim 16, wherein the phase difference is calculated from the measured value of the optical bath difference between the light passing through the light screening pattern and the light passing through an opening of the light screening pattern.

19. The process for production of a mask for light exposure according to claim 16, wherein the phase difference is calculated from a changed amount of focus position of the light passing through the opening of the light screening pattern in an optical image at virtual non-transferred substrate plane.

20. The process for production of a mask for light exposure according to claim 16, wherein the step of measuring the phase difference is carried out on the individual patterns having different engraved amount from that of the light screening pattern and an area of the light transparent substrate to be not engraved, using a phase measuring light having the longer wavelength than that of the exposure light, and the engraved amount of the individual patterns or the phase difference is obtained from the difference between respective optical paths and the wavelength used for measuring the optical path, refractive index at the wavelength for measuring the optical path, the wavelength of the light exposure, and refractive index of the light transparent substrate at the wavelength of the light exposure.

21. In a method for production of a mask for light exposure provided with a light transparent substrate and a mask pattern, formed on the light transparent substrate, comprising a light screening pattern and a phase shift pattern formed by engraving a part of the light transparent substrate, said process comprising the following steps:

a step of forming the light screening pattern composed of a material which screens the exposure light and transmits a phase measuring light having the longer wavelength than that of the exposure light, on the light transparent substrate, a step of etching the substrate using the light screening pattern and a resist as a mask while selectively masking an opening of the light screening pattern with the resist and determining the phase difference between the light passing through the light screening pattern and the light passing through the opening of the light screening pattern using the phase measuring light having a wavelength such that the light screening material transmits, then stopping etching at a time when the desired phase difference is obtained, a step of, after removal of the resist, etching the substrate using the light screening pattern as a mask while determining the phase difference between the light passing through the light screening pattern and the light passing through the opening of the light screening pattern using the phase measuring light having the longer wavelength than that of the exposure light, then stopping etching at a time when the desired phase difference is obtained.

22. The process for production of a mask for light exposure according to claim 21, wherein the step of forming the light screening pattern is carried out by forming a light screening pattern, on the light transparent substrate, composed of a material which screens the exposure light and transmits at least a part of the light having the longer wavelength than that of the exposure light and shorter than 700 nm.

23. The process for production of a mask for light exposure according to claim 21, wherein the phase difference is calculated from the measured value of the optical path difference between the light passing through the light screening pattern and the light passing through an opening of the light screening pattern.

24. The process for production of a mask for light exposure according to claim 21, wherein the phase difference is calculated from a changed amount of focus position of the light passing through the opening of the light screening pattern in an optical image at virtual non-transferred substrate plane.

25. The process for production of a mask for light exposure according to claim 21, wherein the step of measuring the phase difference is carried out on the individual patterns having different engraved amount from that of the light screening pattern and an area of the light transparent substrate to be not engraved, using the phase measuring light the longer wavelength than that of the exposure light, and the engraved amount of the individual patterns or the phase difference is obtained from the difference between respective optical paths and the wavelength used for measuring the optical path, refractive index at the wavelength for measuring the optical path, the wavelength of the light exposure, and refractive index of the light transparent substrate at the wavelength of the light exposure.

* * * * *

UNITED STATES PATENT AND TRADEMARK OFFICE
CERTIFICATE OF CORRECTION

```
PATENT NO.   :   5,700,605
DATED        :   December 23, 1997
INVENTOR(S)  :   Shin-ichi ITO et al.
```

It is certified that error appears in the above-indentified patent and that said Letters Patent is hereby corrected as shown below:

```
On the title page, Item [30], the 2nd priorty date should
read:

-- Mar. 12, 1996 --
```

Signed and Sealed this

Twenty-fourth Day of February, 1998

Attest:

BRUCE LEHMAN

*Attesting Officer*   *Commissioner of Patents and Trademarks*